United States Patent [19]
Hsu et al.

[11] Patent Number: 5,543,344
[45] Date of Patent: Aug. 6, 1996

[54] METHOD OF MAKING PROGRAMMABLE READ-ONLY MEMORY

[75] Inventors: Chen-Chung Hsu, Taichung; Gary Hong, Hsinchu, both of Taiwan

[73] Assignee: United Microelectronics Corp., Hsinchu, Taiwan

[21] Appl. No.: 318,474

[22] Filed: Oct. 5, 1994

[51] Int. Cl.$^6$ .............................................. H01L 21/8246
[52] U.S. Cl. ................................. 437/52; 437/48; 437/60
[58] Field of Search ................................. 437/48, 52, 60, 437/904; 257/529, 530; 237/209; 365/105, 96, 175, 186

[56] References Cited

U.S. PATENT DOCUMENTS

| | | | |
|---|---|---|---|
| 4,609,998 | 9/1986 | Bosnyak et al. | 365/96 |
| 4,701,780 | 10/1987 | Hankins et al. | 257/530 |
| 4,757,359 | 7/1988 | Chiao et al. | 257/530 |
| 4,881,114 | 11/1989 | Mohsen et al. | 357/54 |
| 5,130,770 | 7/1992 | Galbraith | 257/530 |
| 5,258,643 | 11/1993 | Cohen | 257/530 |
| 5,350,710 | 9/1994 | Hong et al. | 437/60 |

FOREIGN PATENT DOCUMENTS

| | | | |
|---|---|---|---|
| 111885 | 7/1982 | Japan | 365/96 |
| 2222024 | 2/1990 | United Kingdom | 257/530 |

OTHER PUBLICATIONS

Gaensslen "Schottky Barrier Read–Only Memory" IBM TDB Jun. 1971 pp. 252–53.
S. A. Abbas "Electronically Encodable Read Only Store" IBM TDB Nov. 70 pp. 1426–1427.

Primary Examiner—Tom Thomas
Attorney, Agent, or Firm—Ladas & Parry

[57] ABSTRACT

A programmable read-only memory (PROM) and a method of fabrication are described. A plurality of bit-lines of a first conductivity type are formed in a semiconductor substrate and are spaced apart along a first direction. A dielectric layer is disposed on the semiconductor substrate, wherein the dielectric layer has a plurality of vias at predetermined positions above the bit-lines. A plurality of word-lines of a second conductivity type are disposed on the dielectric layer and spaced apart along a second direction substantially orthogonal to the first direction. A control layer is disposed within the vias and sandwiched between the bit-lines and the word-lines, wherein each crossing region of the bit-lines and the word-lines with the control layer disposed there between define a memory cell of the programmable read-only memory. When programming the PROM, selected memory cells of the programmable read-only memory are set in an ON state by applying a programming voltage higher than the normal reading voltage on the word-lines of the selected memory cells while grounding the bit-lines of the selected memory cells to break down the corresponding control layers, whereby the remaining memory cells of the PROM are allowed to remain in an OFF state.

8 Claims, 3 Drawing Sheets

METHOD OF MAKING PROGRAMMABLE READ-ONLY MEMORY

BACKGROUND OF THE INVENTION

1. Field of the Invention

The invention relates to read-only memory devices, and more particularly to a new programmable read-only memory (PROM) using a diode structure and a method of fabricating same.

2. Description of the Prior Art

Read-only memories, which comprises an array of memory cells, are widely utilized in digital electronic equipment. For example, computer systems including microcomputers and minicomputers use read-only memories for storing fixed software/firmware routines. A programmable read-only memory (PROM) is a fixed, non-volatile memory. Normally, a PROM's memory cells are pre-programmed with specific data at the time the PROM is manufactured and before the PROM is delivered to a customer. The fabrication process for PROM devices is complicated and requires sophisticated processing steps, each of which consumes precious manufacturing time for material processing and for adjusting manufacturing parameters.

The manufacturing process steps for most compatible PROM devices are virtually the same, up to the point where each PROM is programmed with its respective memory contents. Thus, it is possible to manufacture PROM devices to a semi-finished stage and store them until they are needed to be programmed with designated memory contents and then are promptly delivered to the customer at their request. Such "post-programmed" mask PROMs are commonly employed in the art of PROM manufacturing.

In the programming stage, a commonly used technique to program the memory cells in the PROM selectively implants impurities into predetermined memory cells to adjust their threshold voltage, so as to set them permanently in an ON state or in an OFF state. However, it is hard to precisely control the implanting energy and dosage of the impurities in scaled down process techniques. Moreover, a mask is needed to implant only the cells which are programmed, and that fact increases the complexity of manufacture.

Another prior art programming method forms a dielectric layer at a position within metal contacts of selected memory cells. The dielectric layer acts as a control layer. Thus, memory cells with the control layer are permanently set in an OFF state, while memory cells without the control layer are permanently set in an ON state. This programming process will be better understood from the following detailed description. Turning to FIG. 1, an active region is defined by forming a field oxide layer 11 on a silicon substrate 10 using a conventional LOCOS process. A MOS transistor comprising a polysilicon gate electrode 12 (word-line) and source/drain regions 13 (bit-lines) is formed in the active region and serves as a memory cell of the PROM device. A dielectric layer 14 is deposited overlying the MOS transistor, and metal contacts are formed therein to expose the underlying source/region regions. A control layer 15, such as a silicon dioxide layer or a silicon nitride layer, is next formed within the metal contact of selected memory cells. Finally, a metal line 16 is formed on the dielectric layer 14 completing the programming process of the prior art PROM device.

FIGS. 2A and 2B are schematic circuit diagrams showing the OFF state and ON state of the prior art PROM device, respectively. The conducting metal line 16 and source/drain regions 13 and the dielectric control layer 15 together function as a capacitor. Thus, the MOS transistor with control layer 15 is not conductive, i.e. assumes an OFF state, as shown in FIG. 2A. On the other hand, the MOS transistor without the control layer 15 is conductive, i.e. assumes an ON state, as shown in FIG. 2B.

However, in the prior art programming process a mask is needed to define the control layer 15, which increases the complexity of processing and reduces the efficiency of manufacture. Besides, since a MOS transistor is used to serve as a memory cell and a field oxide layer 11 is formed to isolate the MOS transistors, it is hard to further reduce the memory cell size. Hence, the prior art PROM device is not well suited for scaled down processing.

SUMMARY OF THE INVENTION

It is therefore an object of the present invention to provide a new programmable read-only memory having reduced memory cell size.

It is another object of the present invention to provide a method of fabricating a programmable read-only memory, which can decrease the number of process steps to thereby result in better manufacturing efficiency.

In accordance with the objects of this invention, a programmable read-only memory (PROM) and a method of fabrication are provided. The PROM uses a diode structure instead of a MOS transistor structure to reduce the memory cell size. The PROM comprises: a semiconductor substrate; a plurality of bit-lines of a first conductivity type formed in the semiconductor substrate and spaced apart along a first direction; a dielectric layer disposed on the semiconductor substrate, wherein the dielectric layer has a plurality of vias at predetermined positions above the bit-lines; a plurality of word-lines of a second conductivity type disposed on the dielectric layer and spaced apart along a second direction substantially orthogonal to the first direction; and a control layer disposed within the vias and sandwiched between the bit-lines and the word-lines, wherein each crossing region between the bit-lines and the word-lines with the control layer disposed there between define a memory cell of the programmable read-only memory.

When programming the PROM, selected memory cells of the programmable read-only memory are set permanently in an ON state by applying a programming voltage, typically between 10 to 20 V, on the word-lines of the selected memory cells while grounding the bit-lines of the selected memory cells to break down the corresponding control layers. The other memory cells of the programmable read-only memory are allowed to remain in an OFF state.

BRIEF DESCRIPTION OF THE DRAWINGS

Other objects, features and advantages of the present invention will become apparent by way of the following detailed description of a preferred, but non-limiting embodiment, with reference to the accompanied drawings, wherein.

DETAILED DESCRIPTION OF THE PREFERRED EMBODIMENT

A preferred embodiment of the present invention will now be described with reference to FIGS. 3A and 3B.

Figure 1:
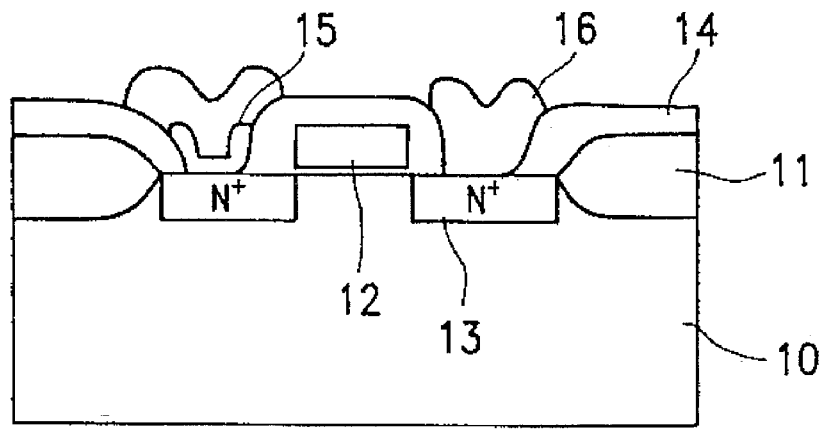
FIG. 1 schematically illustrates, in cross sectional view, a prior art read-only memory cell.
Figure 2A:
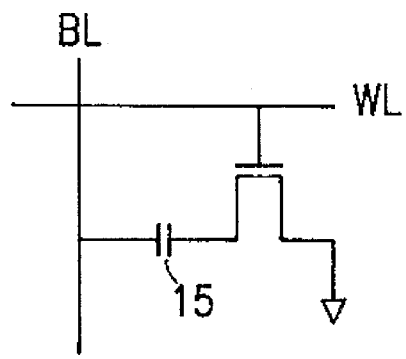
FIGS. 2A and 2B are schematic circuit diagrams showing the OFF state and ON state of a prior art read-only memory, respectively.
Figure 2B:
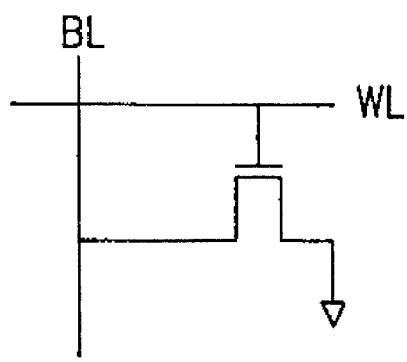
Figure 3A:
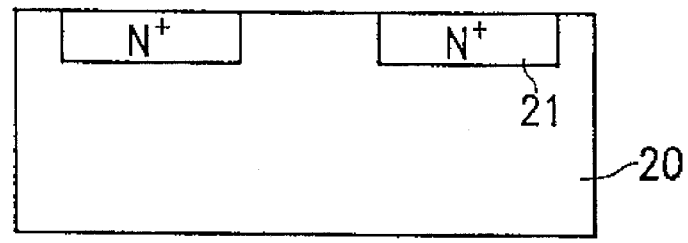
FIGS. 3A to 3D illustrate, in cross sectional views, the process steps for making and structure of a preferred embodiment of a programmable read-only memory cell according to the present invention.

Referring to FIG. 3A, there is shown a silicon substrate 20. A photoresist layer (not shown) is coated and patterned by conventional lithography process steps. Impurities of a first conductivity type, such as N type ions, are implanted into the silicon substrate 20 to form buried $N^+$ bit-lines 21, using the photoresist layer as a mask. In this preferred embodiment, arsenic ions, preferably with an implanting energy of between 50 to 100 KeV and a dosage of between $1\times10^{14}$ to $1\times10^{16}$ atoms/cm$^2$, or phosphorous ions, preferably with an implanting energy of between 20 to 60 KeV and a dosage of between $1\times10^{14}$ to $1\times10^{16}$ atoms/cm$^2$, are utilized. After the ion implanting process, the photoresist is removed by using an appropriate solvent.

Figure 3B:
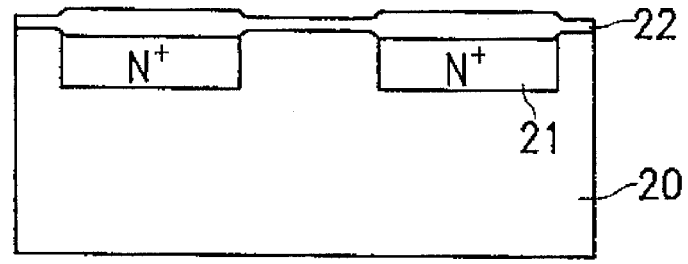
Figure 3C:
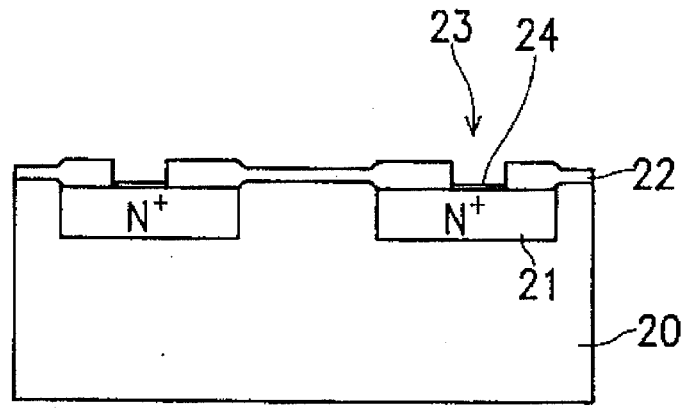

Referring now to FIG. 3B, a silicon dioxide layer 22 is formed by thermal oxidation at temperature of about 900° C. Please note that the thickness of portions of the silicon dioxide layer 22 over the buried $N^+$ bit-lines 21 are greater than that of the other portions. Next, a plurality of vias 23 are formed at predetermined positions in the silicon dioxide layer 22, preferably by reactive ion etching (RIE), to expose portions of the buried $N^+$ bit-lines 21, as is shown in FIG. 3C. A control layer 24, such as a silicon dioxide layer with a thickness of between 50Å to 120Å, is formed, by thermal oxidation or chemical vapor deposition (CVD), on the exposed portions of the buried $N^+$ bit-lines 21 at the bottoms of the vias 23. A silicon nitride layer with a thickness of between 50Å to 120Å, which is formed preferably by CVD, can be used as the control layer 24 as well.

Figure 3D:
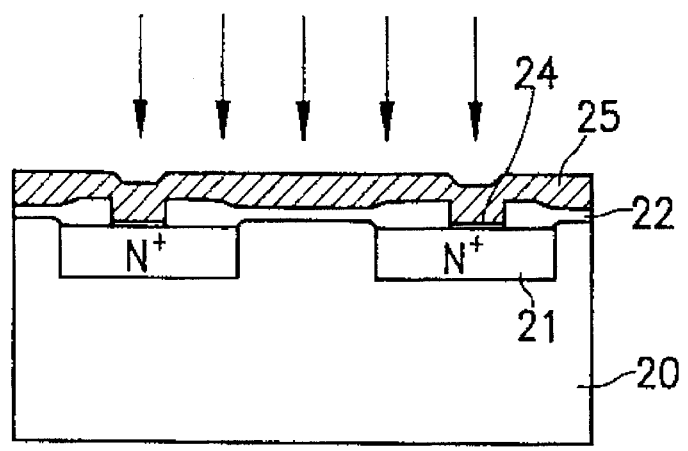
Figure 4:
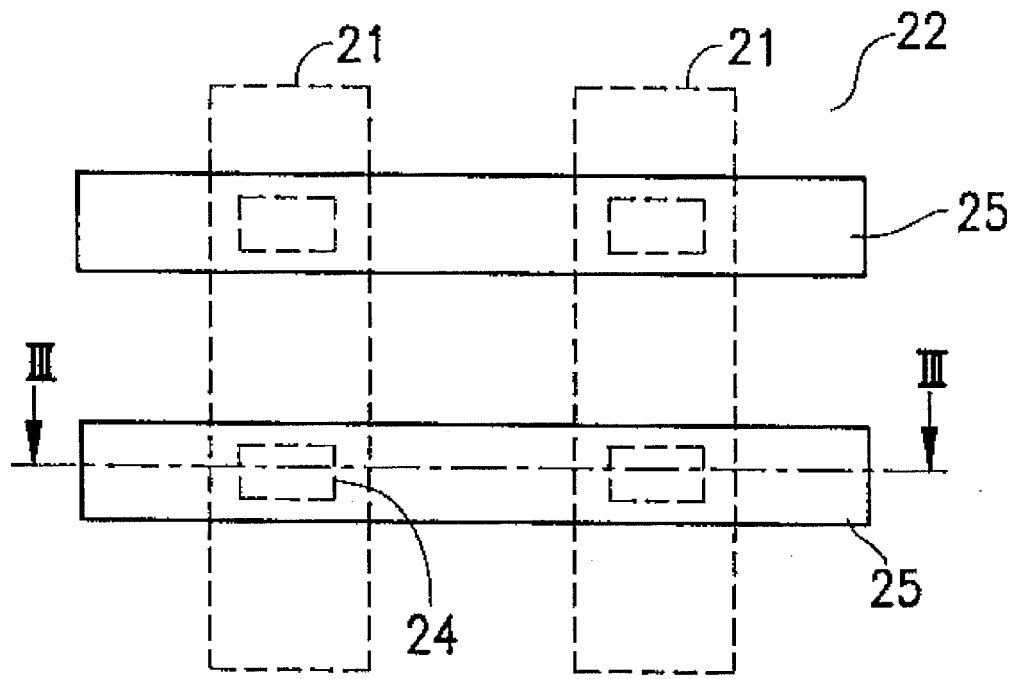
FIG. 4 shows a plan view of a programmable read-only memory cell corresponding to FIG. 3D.

Turning now to FIG. 3D, a conducting layer, such as a polysilicon layer, is formed overlying the silicon dioxide layer 22 by CVD. Impurities of a second conductivity type, such as P type boron ions, preferably with an energy between 50 to 100 KeV and a dosage between $1\times10^{15}$ to $5\times10^{16}$ atoms/cm$^2$, are implanted into the polysilicon layer to improve its conductivity and set the conductivity type of the polysilicon layer different from that of the buried $N^+$ bit-lines 21. Next, conventional lithography and etching processes are performed to define the patterns of the $P^+$ polysilicon layer, so as to form $P^+$ word-lines 25 which cover the vias 23 and cross the buried $N^+$ bit-lines 21 more or less orthogonally. Each region where the buried $N^+$ bit-lines 21 and the $P^+$ word-lines 25 cross each other and the corresponding control layer 24 there between define a memory cell of the programmable read-only memory, as is shown in FIG. 4.

Figure 5A:
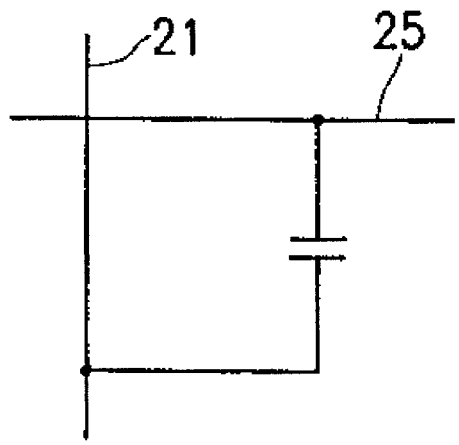
FIGS. 5A and 5B are schematic circuit diagrams showing the OFF state and ON state, respectively, of a programmable read-only memory cell in accordance with this invention.
Figure 5B:
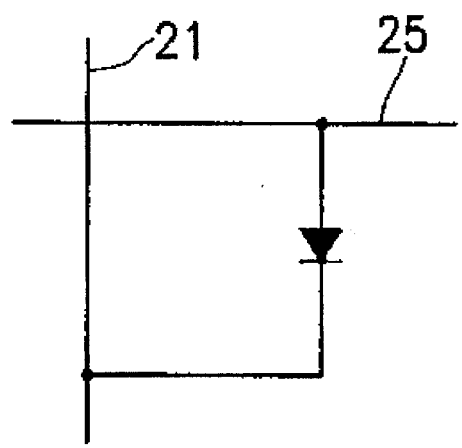

The programming process for the programmable read-only memory according to this invention will now be described with reference to FIGS. 5A and 5B. The word-line 25, the bit-line 21, and the control layer 24 together function as a capacitor, as is shown in FIG. 5A. While applying a normal voltage used to read a PROM device, such as 5 V, on a word-line 25 and grounding a bit-lines 21, the memory cell is not conductive, i.e. it is in an OFF state. On the other hand, if a higher voltage, for example, between 10 and 20 V, is applied on the word-line 25 while the bit-line 21 is grounded, the control layer 24 will be caused to break down. As a result, the bit-line 21 and the word-line 25 now function together as a diode, as is shown in FIG. 5B. The memory cell now is conductive, i.e. in an ON state, when a normal reading voltage, such as 5 V, is applied. Therefore, the PROM can be easily programmed by selectively applying a programming voltage, typically between 10 to 20 V, on desired word-lines while grounding desired bit-lines to break down the corresponding control layers, so as to set those memory cells in their ON state and leave other memory cells in their OFF state.

In contrast to the prior art PROM, the programmable read-only memory and method of fabrication in accordance with the present invention can provide the following advantages:

1. The memory cell size can be reduced to a minimum due to the use of a diode structure instead of a MOS transistor structure.

2. Additionally, with the use of a diode structure for the memory cells, there is no need to form a field oxide layer for isolation. This further reduces the chip area which is needed.

3. Compared to the prior art processes, the control layer 24 can be formed without using a mask. So the lithography steps used to define the corresponding mask can be eliminated.

4. The programming process is performed by applying a high programming voltage on selected word-lines 25 without using a mask. This decreases the process steps and results in better manufacturing efficiency.

Although the description of the present invention relates to a diode structure with buried $N^+$ bit-line and $P^+$ word-line, the principle of the present invention may be applied to a diode structure with $P^+$ buried bit-line and $N^+$ word-line as well. Persons skilled in the art will similarly appreciate that the particular conditions, parameters, and materials discussed with reference to the preferred embodiment of the present invention may be changed or modified without departing from the scope and spirit of the disclosure of the present invention. It therefore should he pointed out that the above description based on the described embodiment of the present invention is only intended to describe the invention, not to limit the scope of the invention, which is defined in the claims below.

What is claimed is:

1. A method of fabricating programmable read-only memory on a semiconductor substrate, comprising the steps of:

implanting impurities into said semiconductor substrate to form a plurality of bit-lines of a first conductivity type spaced apart along a first direction by unimplanted portions of said semiconductor substrate;

forming a dielectric layer overlying said semiconductor substrate, said dielectric layer having a thickness over said bit-lines larger than a thickness over said unimplanted portions of said semiconductor substrate.;

forming a plurality of vias in said dielectric layer at predetermined positions above said plurality of bit-lines;

forming a control layer within said plurality of vias; and forming a plurality of word-lines of a second conductivity type overlying said control layer and said dielectric layer within said plurality of vias, said word-lines being spaced apart along a second direction substantially orthogonal to said first direction, and wherein each region where one said plurality of bit-lines and one of said plurality of word-lines crosses with said control layer being disposed there between define a memory cell of said programmable read-only memory.

2. The method of fabricating programmable read-only memory on a semiconductor substrate of claim 1, wherein said impurities are arsenic ions with implanting energy of between 50 to 100 KeV and with dosage between $1 \times 10^{14}$ to $1 \times 10^{16}$ atoms/cm$^2$.

3. The method of fabricating programmable read-only memory on a semiconductor substrate of claim 1, wherein said impurities are phosphorous ions with implanting energy of between 20 to 60 KeV and with dosage between $1 \times 10^{14}$ to $1 \times 10^{16}$ atoms/cm$^2$.

4. The method of fabricating programmable read-only memory on a semiconductor substrate of claim 1, wherein said dielectric layer is a silicon dioxide layer formed at temperature of about 900° C.

5. The method of fabricating programmable read-only memory on a semiconductor substrate of claim 1, wherein said control layer is a silicon dioxide layer with thickness of between 50Å to 120Å.

6. The method of fabricating programmable read-only memory on a semiconductor substrate of claim 1, wherein said control layer is a silicon nitride layer with thickness of between 50Å to 120Å.

7. The method of fabricating programmable read-only memory on a semiconductor substrate of claim 1, wherein said plurality of word-lines are made of polysilicon implanted by boron ions with implanting energy of between 50 to 100 KeV and with dosage of between $1 \times 10^{15}$ to $5 \times 10^{16}$ atoms/cm$^2$.

8. The method of fabricating programmable read-only memory on a semiconductor substrate of claim 1, wherein selected memory cells of said programmable read-only memory are set in an ON state by applying a programming voltage between approximately 10 to 20 V on the word-lines of said selected memory cells while grounding the bit-lines of said selected memory cells to break down the corresponding control layer, whereby other memory cells of said programmable read-only memory are maintained in an OFF state.

* * * * *